(12) United States Patent
Welland

(10) Patent No.: US 8,193,822 B2
(45) Date of Patent: Jun. 5, 2012

(54) SYSTEM AND METHOD FOR DETERMINING CAPACITANCE VALUE

(75) Inventor: David Welland, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 82 days.

(21) Appl. No.: 12/494,417

(22) Filed: Jun. 30, 2009

(65) Prior Publication Data

US 2010/0201382 A1    Aug. 12, 2010

Related U.S. Application Data

(60) Provisional application No. 61/152,071, filed on Feb. 12, 2009.

(51) Int. Cl.
*G01R 27/26* (2006.01)
(52) U.S. Cl. ......................... 324/686; 324/658
(58) Field of Classification Search .................. None
See application file for complete search history.

(56) References Cited

U.S. PATENT DOCUMENTS

| | | | | |
|---|---|---|---|---|
| 4,398,426 A * | 8/1983 | Park et al. | | 73/724 |
| 4,860,232 A * | 8/1989 | Lee et al. | | 702/104 |
| 5,345,807 A * | 9/1994 | Butts et al. | | 73/1.15 |
| 5,585,733 A * | 12/1996 | Paglione | | 324/678 |
| 6,624,640 B2 | 9/2003 | Lund et al. | | |
| 6,683,462 B2 | 1/2004 | Shimizu | | |
| 7,129,714 B2 * | 10/2006 | Baxter | | 324/678 |
| 7,307,485 B1 | 12/2007 | Snyder et al. | | |
| 7,312,616 B2 | 12/2007 | Snyder | | |

* cited by examiner

*Primary Examiner* — Vinh Nguyen

(57) ABSTRACT

A circuit for determining a value of a variable capacitor includes first circuitry for generating a first indication when a variable voltage across the variable capacitor exceeds a threshold voltage. Second circuitry generates a second indication when a reference voltage across a reference capacitor exceeds the threshold voltage. Control logic responsive to the first and second indications generate a control signal indicating whether the first indication or the second indication occurs first. A successive approximation engine generates an N-bit control value responsive to the control signal. A variable current source is responsive to the N-bit control value for generating a variable current to the first circuitry. A reference current source generates a reference current to the second circuitry.

18 Claims, 4 Drawing Sheets

SYSTEM AND METHOD FOR DETERMINING CAPACITANCE VALUE

CROSS-REFERENCE TO RELATED APPLICATIONS

This application claims the benefit of U.S. Provisional Patent Application No. 61/152,071, filed Feb. 12, 2009, entitled SYSTEM AND METHOD FOR DETERMINING CAPACITANCE VALUE and this application is related to U.S. patent application Ser. No. 12/146,349, filed on Jun. 25, 2008, entitled LCD CONTROLLER CHIP, which is incorporated herein by reference.

TECHNICAL FIELD

The present invention relates to determining capacitance value for a capacitor that is associated with a touch sensitive capacitive switch that may be a stand alone switch or incorporated in a capacitive sensor array, and more particularly, to a system and method for determining a capacitance value using successive approximation techniques.

BACKGROUND

Electronic circuit design often requires the use of various interface circuitries such as capacitive sensor arrays that enable the user to interact with or receive information from an electronic circuit. Typically, dedicated sensing circuitry may be used to detect the activation of various capacitive switches within a capacitive sensor array enabling a user to input particular information into a circuit.

Within a capacitive sensor array there is needed the ability to detect differences in the capacitance value of a capacitive switch responsive to the placement of a user's finger upon the capacitive switch. In addition to detecting the placement of a finger upon a capacitive switch and the associated change in capacitance caused by the finger, there is the need to make the sensing circuitry resistant to external interferences within the capacitive sensor array. Examples of external interferences include cell phones whose transmissions may cause inadvertent detection of increases of capacitance upon the switch. Additionally, electrical main circuits such as those associated with air conditioning or other high use electrical energy units can cause interference within capacitive sensor arrays. Other types of interferences and inaccuracies within the capacitive sensing circuitries may also lend themselves to errors in detection of particular capacitance values within capacitive sensor array circuitry. Thus, there is a need for providing capacitive touch sensor circuitry that enables the detection of a finger upon a capacitive sensor array while limiting the amount of detections based upon external interferences and inaccuracies and interferences inherent within the detection circuitries.

SUMMARY

The present invention, as disclosed and described herein, in one aspect thereof, comprises a circuit for determining a value of a variable capacitor. First circuitry generates a first indication when a variable voltage across the variable capacitor exceeds a threshold voltage. Second circuitry generates a second indication when a reference voltage across a reference capacitor exceeds the threshold voltage. Control logic is responsive to the first and second indications for generating a control signal indicating whether the first indication or the second indication occurs first. A successive approximation engine generates an N-bit control value responsive to the control signal. A variable current source responsive to the N-bit control value generates a variable current to the first circuitry. A reference current source generates a reference current to the second circuitry.

BRIEF DESCRIPTION OF THE DRAWINGS

For a more complete understanding, reference is now made to the following description taken in conjunction with the accompanying Drawings in which.

DETAILED DESCRIPTION

Figure 1:
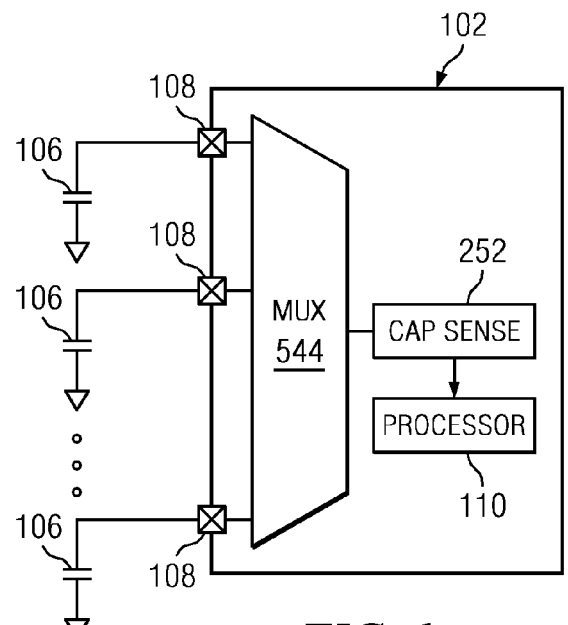
FIG. 1 is an upper level block diagram of an integrated circuit with capacitive sensing capabilities.

Referring now to the drawings, wherein like reference numbers are used herein to designate like elements throughout, the various views and embodiments of a capacitive touch sensor are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated an overall block diagram of an integrated circuit (IC) 102 that interfaces with a plurality of capacitor touch pads 106 that are each interfaced with the IC 102 through respective external pins 108. Each of the capacitor touch pads 106 is comprised of any type of external capacitor wherein the capacitance thereof can be varied by touching the capacitor with a finger or placing the finger in close proximity thereto so as to affect the capacitance value thereof. It should also be understood that any type of capacitive element could be used and not just a capacitive touch pad. The capacitor touch pads 106 can be stand alone elements or they can be part of a capacitive sensor array.

The IC 102 includes a multiplexer 544 which is operable to select one of the external pins 108 and one plate of an associated capacitor touch pad 106 for input to a capacitive sense block 252. The capacitive sense block 252 is operable to determine the value of the capacitance associated with the selected pin 108. This will then allow a determination to be made as to the value of the capacitance associated with pin 108, which will be referred to as the capacitance associated with an "external capacitance switch," this value being the sum of the value of the associated capacitor touch pad 106 and any parasitic capacitance, this parasitic capacitance the result of a finger touch, external interference, etc. The information as to the capacitance value of the external capacitance switch is then passed on to a processor 110 for the purpose of determining changes in capacitance value, etc. with the use of a proprietary algorithm. One example of an application of such is described in U.S. patent application Ser. No. 12/146,349, filed on Jun. 25, 2008, entitled "LCD CONTROLLER CHIP," which is incorporated herein by reference in its entirety. It should be understood that the multiplexer 544 could be realized with a switch.

In general, one application would be to individually sense the static value of each of the external capacitance switches are each of the pins 108 at any given time and continually scan these external capacitance switches to determine if a change in capacitance has occurred, i.e., the value of the capacitance value has changed by more than a certain delta. If so, with the use of a proprietary algorithm, a decision can be made as to whether this constitutes a finger touch or external interference. However, the capacitive sense block 252 is primarily operable to determine the value of the external capacitance switch and then, possibly, provide some hardware control for accumulating the particular values and comparing them with prior values for generating an interrupt to the processor 110. However, the first object of the capacitive sense block 252 is to determine the value of the external capacitance switch connected to a particular pin 108 being scanned at any particular time.

Figure 2A:
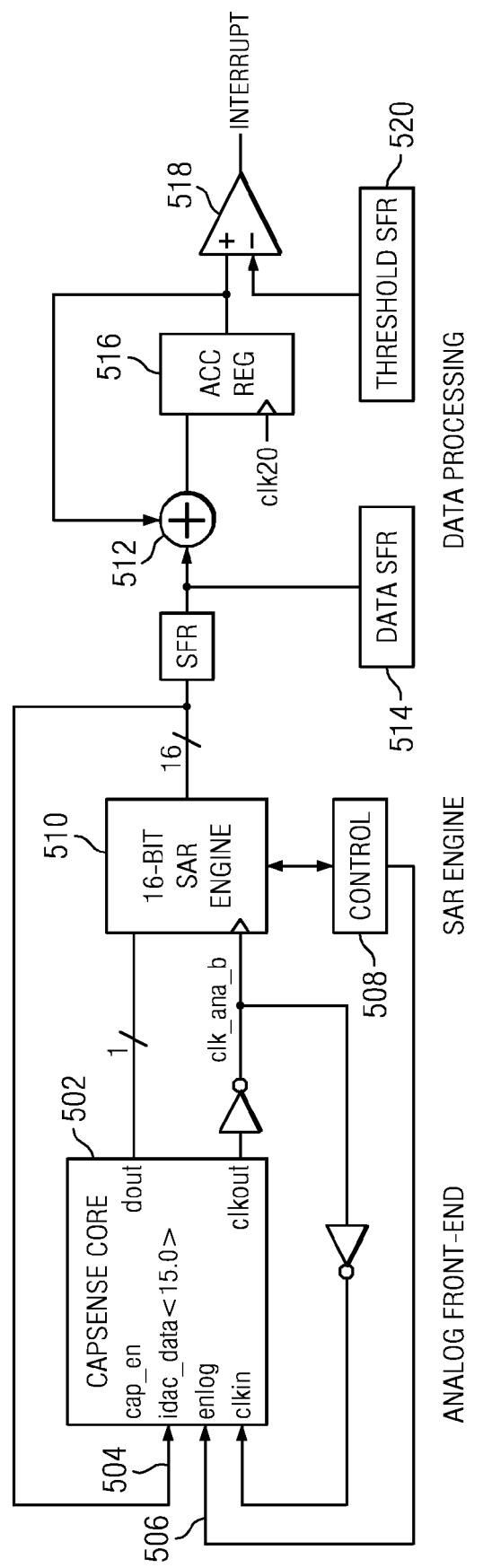
FIG. 2a is a functional block diagram of the capacitive touch sense circuitry.
Figure 2B:
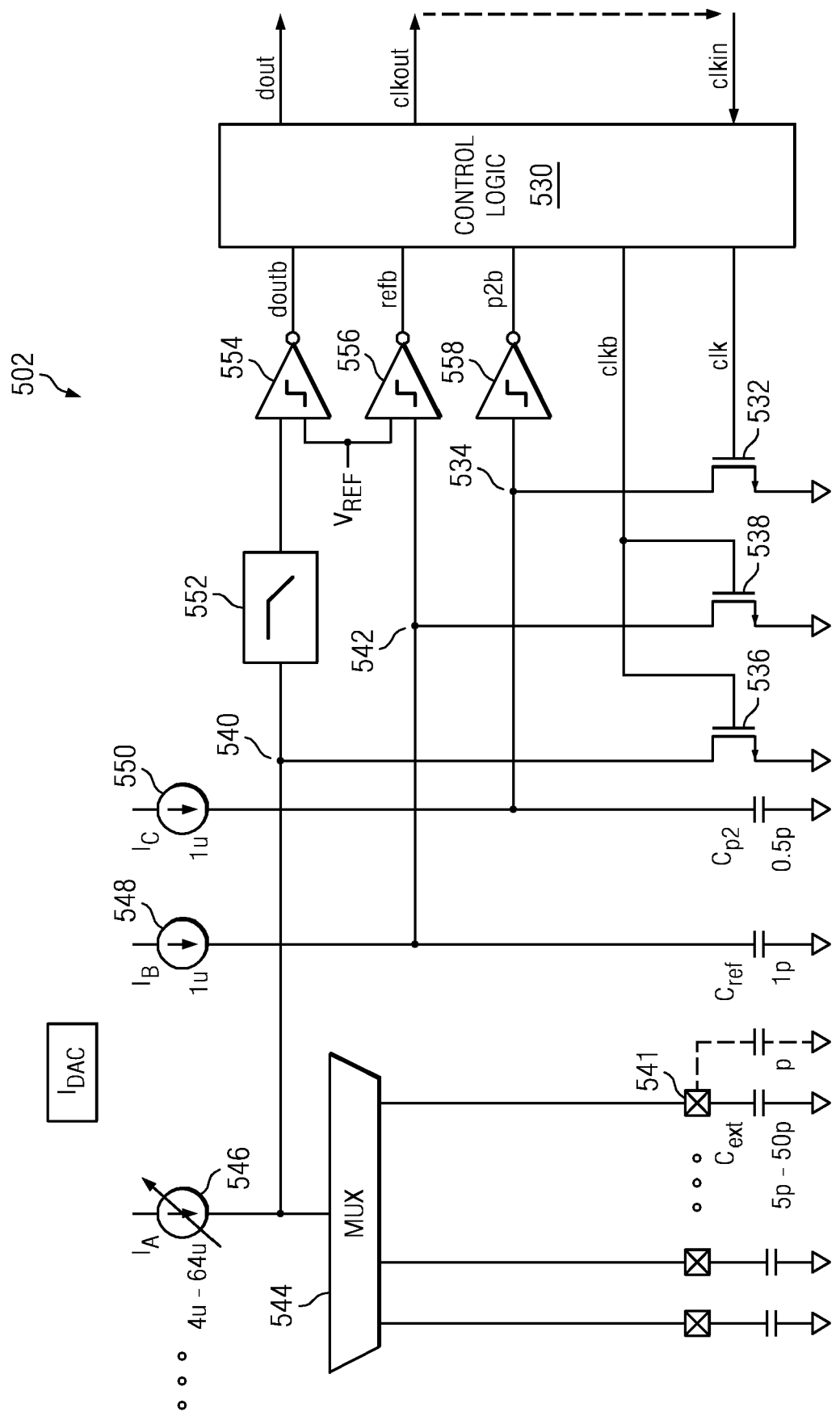
FIG. 2b illustrates a block diagram of the analog front end circuitry.

Referring now to FIGS. 2a and 2b, there is illustrated a functional block diagram of the capacitive touch sense block 252. The analog front end circuitry 502 shown in FIG. 2a is responsible for a connected external capacitance switch for the purpose of determining the value of the capacitance. The analog front end circuitry 502 receives a 16-bit current control value which is provided to the input IDAC_DATA via input 504 for controlling a variable current source. This current is generated by a current digital-to-analog converter (IDAC), not shown. The analog front end also receives an enable signal at the input ENLOG 506 from a control circuit 508. The analog front end circuitry 502 additionally provides a clock signal. A 16-bit successive approximation register engine 510 controls a first variable current source within the analog front end circuitry 502 that drives the external capacitance switch. The 16-bit SAR engine 510 changes a control value which defines a present value of a variable current $I_A$ that drives an external capacitor $C_{EXT}$ (as seen in FIG. 2b) on a selected one of the output pads 541. This selection is made by multiplexer 544, and the capacitor $C_{EXT}$ corresponds to capacitor touch pad 106 in combination with any parasitic capacitance the external capacitance switch. The current source generating the current $I_A$ that drives the selected external capacitor $C_{EXT}$ from current source 546 will cause a voltage to be generated on that external capacitance switch $C_{EXT}$ that is compared to the voltage across an internal reference capacitor $C_{REF}$ (as shown in FIG. 2b). This capacitor $C_{REF}$ if an internal capacitor and the current provided thereto from an internal current source is a constant current. Both capacitors, the selected capacitor $C_{EXT}$ and the reference capacitor $C_{REF}$, are initialized at a predetermined point and the currents driven thereto allow the voltages on the capacitors $C_{EXT}$ and $C_{REF}$ to ramp-up at the rate determined by the respective capacitance value and the current provided by the respective current sources that provide driving current thereto. By comparing the ramp voltages and the ramp rates, a relative value of the two currents can be determined. This is facilitated by setting a digital value to the IDAC and determining if the ramp rates are substantially equal. If the capacitors $C_{EXT}$ and $C_{REF}$ were identical, then the two ramp rates would be substantially identical when the current driving capacitors $C_{EXT}$ and $C_{REF}$ are substantially identical. If the capacitor $C_{EXT}$ is larger, this would require more current to derive a ramp rate that is substantially identical to the capacitor $C_{REF}$. This will be described in more detail herein below. Once the SAR algorithm is complete, the 16-bit value "represents" the capacitance value of the external capacitance switch on the external node.

The current source control value for variable current source 546 is also provided to an adder block 512. The control value establishing the necessary controlled current is stored within a data Special Function Register (SFR) 514 representing the capacitive value of the external capacitive switch. This SFR 514 is a register that allows for a data interface to the processor 110. Second, an input may be provided to an accumulation register 516 for the purpose of determining that a touch has been sensed on the presently monitored external capacitance switch of the capacitive sensor array. Multiple accumulations are used to confirm a touch of the switch, depending upon the particular algorithm utilized. The output of the accumulation register 516 is applied to the positive input of a comparator 518 which compares the provided value with a value from a threshold SFR register 520. When a selected number of repeated detections of activations, i.e., changes, of the associated external capacitance switch within the capacitive sensor array have been detected, the comparator 518 generates an interrupt to the processor 110. The output of the accumulation register 516 is also provided to the adder block 512.

Referring now specifically to FIG. 2b, there is illustrated a more detailed diagram of the analog front end circuitry 502. The analog front end circuitry 502 includes control logic 530 that provides an output $d_{out}$ that is provided to the successive approximation register engine 510 and the output clock "clk_out." $d_{out}$ indicates a condition indicating that the ramp voltage on $C_{EXT}$ was faster than the ramp voltage across $C_{REF}$, this indicating that the SAR bit being tested needs to be reset to "zero." The logic 530 receives an input clock signal "clkn" and provides an output clock signal "clk" and an output clock signal "clkb" (clock bar) to a series of transistors.

The output "clk" is provided to a first n-channel transistor 532. The drain/source path of transistor 532 is connected between node 534 and ground. The gate of transistor 532 is connected to receive the "clk" signal. The gates of transistors 536 and 538 are connected to the clock bar signal "clkb." The drain/source path of transistor 536 is connected between node 540 and ground, node 540 being connected to an output pad 541 via multiplexer 544. The drain/source path of transistor 538 is connected between node 542 and ground.

The transistors 536, 538 and 532 act as discharge switches for capacitors $C_{EXT}$, $C_{REF}$ and $C_{P2}$, respectively. Capacitor $C_{EXT}$ is connected between the associated output of multiplexer 544 and ground. Capacitor $C_{REF}$ is connected between internal node 542 and ground. Capacitor $C_{P2}$ is connected between internal node 534 and ground. The capacitor $C_{EXT}$ represents the external capacitance switch for the selected capacitor touch pad 106 of the capacitive sensor array and is variable in value. The capacitive value thereof can change based upon whether the associated capacitor touch pad 106 is being actuated by the finger of the user or not. The multiplexer 544 or other switching circuitry is utilized to connect other external capacitance switches within the capacitive sensor array to node 540 to determine their capacitive values.

The variable current source 546 provides a current input to node 540. The variable current source 546 (an IDAC) is under the control of a 16-bit data control value that is provided from the successive approximation register engine 510. The current source 546 is used for charging the capacitor $C_{EXT}$ when transistor 536 is off, this providing a "ramp" voltage since current source 546 provides a constant current $I_A$. When transistor 536 is conducting, the charging current and the voltage on capacitor $C_{EXT}$ are shorted to ground, thus discharging $C_{EXT}$.

The current source 548 provides a constant charging current $I_B$ into node 542. This charging current provides a charging source for capacitor $C_{REF}$ when transistor 538 is off to generate a "ramp" voltage, and the current $I_B$ is sinked to ground when transistor 538 is conducting, thus discharging capacitor $C_{REF}$. Likewise, current source 550 provides a constant charging current $I_C$ to node 534. This current source 550 is used for charging capacitor $C_{P2}$ to generate a "ramp" voltage when transistor 532 is off, and $I_C$ is sinked to ground when transistor 532 is conducting, thus discharging capacitor $C_{P2}$.

Connected to node 540 is a low pass filter 552. The low pass filter 552 is used for filtering out high frequency interference created at the external capacitance switch in the capacitive sensor array. The output of the low pass filter 552 is connected to the input of a comparator 554. The comparator 554 compares the ramp voltage at node 540 representing the charging voltage on capacitor $C_{EXT}$ to a threshold reference voltage $V_{REF}$ (not shown) and generates a negative pulse when the ramp voltage at node 540 crosses the reference voltage $V_{REF}$. This is provided to the control logic 530 as signal "doutb." Similarly, a comparator 556 compares the ramp voltage of the fixed capacitance $C_{REF}$ at node 542 with the threshold reference voltage $V_{REF}$ and generates an output negative pulse "refb" when the voltage at node 542 crosses the threshold reference voltage $V_{REF}$. Finally, the comparator 558 compares the ramp voltage at node 534 comprising the charge voltage on capacitor $C_{P2}$ with the threshold reference voltage $V_{REF}$ and generates an output responsive thereto as signal "p2b" when the ramp voltage at node 534 exceeds the threshold reference voltage.

The circuit in FIG. 2b operates by initially resetting the voltage on capacitors $C_{EXT}$ and $C_{REF}$ to zero by turning on transistors 536 and 538. This causes the voltage on capacitors $C_{EXT}$ and $C_{REF}$ to discharge to ground. The transistors 536 and 538 are then turned off, and the voltage on capacitors $C_{EXT}$ and $C_{REF}$ begins to ramp up toward the reference voltage $V_{REF}$ responsive to the current output of the respective current sources 546 and 548. If the voltage across capacitor $C_{EXT}$ reaches the threshold voltage $V_{REF}$ prior to the voltage across capacitor $C_{REF}$ reaching the threshold voltage, this trips the output of comparator 554 to provide a negative pulse and this information is provided from the control logic 530 as output $d_{out}$ to the successive approximation register engine 510 to allow the SAR bit being tested to remain a "one", and a next value of the 16-bit control value for the current source 546 will be selected for testing when CREF crosses the threshold reference voltage level $V_{REF}$. Since the comparator 554 "tripped" before comparator 556, this indicates less current is needed for the next bit tested.

The control logic 530 generates the $d_{out}$ signal controlling the operation of setting bits of the 16-bit SAR control value by the successive approximation register engine 510 responsive to the output from comparator 554. The successive approximation register engine 510 initially sets a most significant bit of the 16-bit control value to "one" and the rest to "zero" to control the variable current source 546 to operate at one-half value. If the output of comparator 554 goes low prior to the output of comparator 556 going low, the $d_{out}$ signal provides an indication to the successive approximation register engine 510 to reset this bit to "zero" and set the next most significant bit to "one" for a next test of the 16-bit SAR control value. However, when the output of comparator 556 goes low prior to the output of comparator 554 going low, the bit being tested remains set to "one" and a next most significant bit is then tested. This process continues through each of the 16-bits of the 16-bit control value by the successive approximation register 510 engine responsive to the signal $d_{out}$ from the control logic 530 until the final value of the 16-bit control value to the variable current source 546 is determined.

The "clkb" output resets the voltages across $C_{EXT}$ and $C_{REF}$ by turning on transistors 536 and 538 to discharge the voltages on these capacitors, and the transistors 536 and 538 are turned off to enable recharging of capacitors $C_{EXT}$ and $C_{REF}$ using the provided respective variable current and the respective reference current, respectively. The voltages across the capacitors $C_{EXT}$ and $C_{REF}$ are again compared by comparators 554 and 556 to the threshold reference voltage $V_{REF}$. When the output of comparator 556 provides a negative output pulse prior to the output of comparator 554 this provides an indication to set an associated bit in the 16-bit control value to "one" as described above. The 16-bit control value that is being provided to the variable current source 546 will be stored when the SAR algorithm is complete at which point both voltages ramp-up at substantially the same rate. The current $I_A$ being provided by the variable current source 546 that is associated with the established 16-bit value, the fixed current $I_B$ of current source 548 and the fixed capacitance value $C_{REF}$ may be used to determine the value of the capacitance $C_{EXT}$ according to the equation $I_A/I_B \times C_{REF}$ using associated processing circuitry of the array controller. Even though the actual value of $C_{EXT}$ could be determined with this equation, this is not necessary in order to determine that the value of the external capacitance switch has changed. For capacitive touch sensing, it is only necessary to determine a "delta" between a prior known value of the external capacitance switch and a current value thereof. Thus, by repeatedly scanning all of the external capacitance switches in the capacitive sensor array and comparing a current value therefor with the prior value therefor, a determination can be made as to whether there is a change. Thus, it is only necessary to have a "normalized" value stored and then compare this pre-stored normalized value with a new normalized value. The actual value is not important but only the delta value is important.

By using similar circuitry to generate the ramp voltages and to compare the voltages at nodes 540 and 542, substantially all common mode errors within the circuitry are rejected. Only the filter 552 upsets the common mode balance between the circuits, but this is necessary to prevent high frequency interference from outside sources such as cell phones. The circuitry for measuring the voltages at the nodes provides a proportional balance between the internal reference voltage and the external capacitance voltage. Thus, errors within the comparators or the reference voltage $V_{REF}$ are not critical as they are the same in each circuit.

Figure 3:
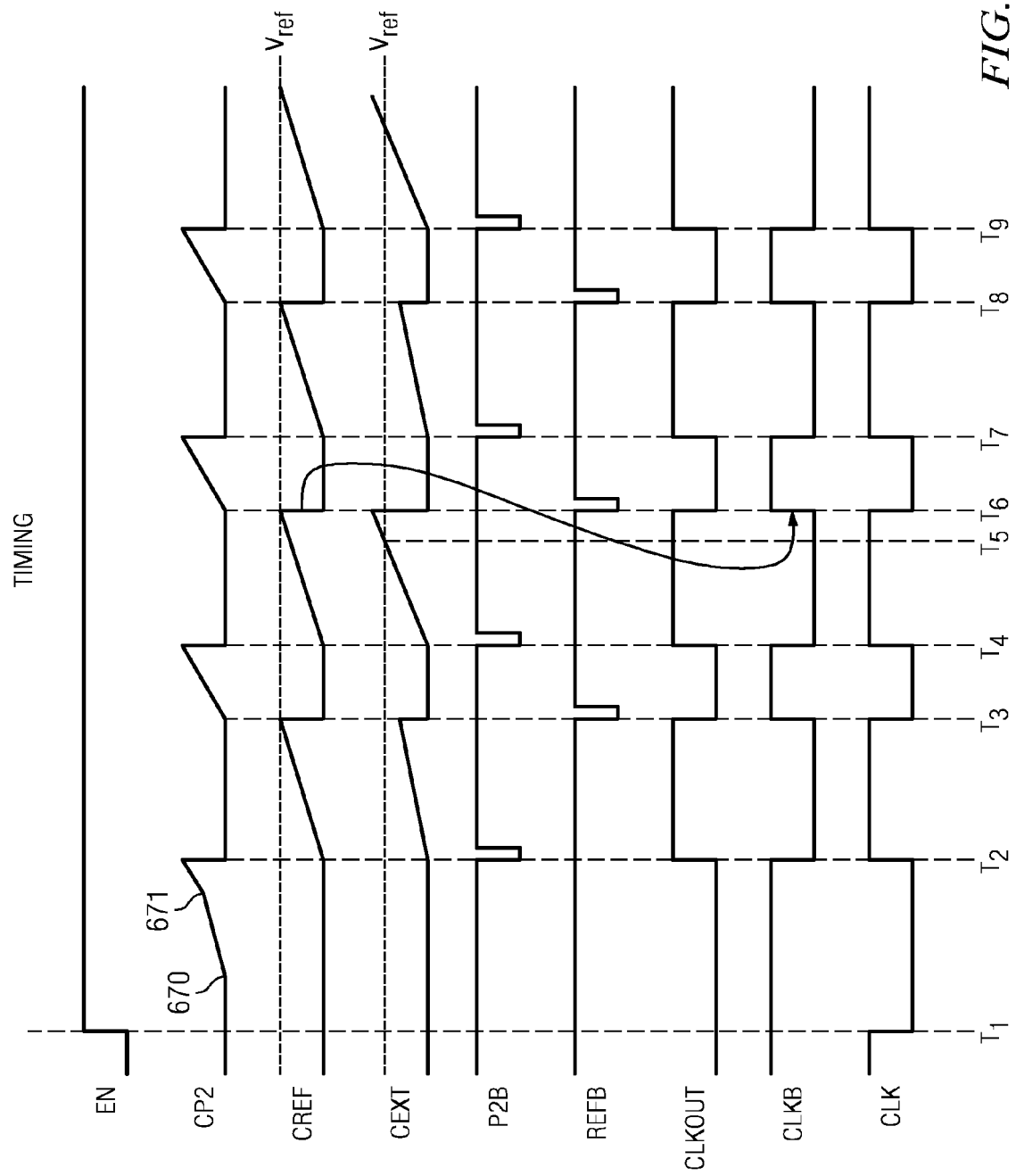
FIG. 3 is a timing diagram illustrating the operation of the circuitry of FIG. 2b.

Referring now to FIG. 3, there is illustrated a timing diagram describing the operation of the analog front end circuitry 502 of FIG. 2b. Nothing may occur within the analog front end circuitry 502 until the enable signal goes logically "high" at time $T_1$. Responsive to the enable signal going high at time $T_1$ the "clk" signal goes low. Shortly after time $T_1$, the voltage CP2 on capacitor $C_{P2}$ begins ramping up at point 670. (Note that the ramp rate for the initial ramp is slower until a point 671 due to start up delays.) When the voltage reaches a set reference voltage level at time $T_2$, the end of a first phase of a two phase clock the comparator 558 generates a low clock pulse as the second phase of the two phase clock as signal P2B and the CLK signal (and CLKOUT signal) goes high. This provides the clock for the analog front end circuitry 502. The CLKB (clock bar) signal also goes low at the same time. The CLKB signal going low turns off transistors 536 and 538 causing the respective voltages across $C_{EXT}$ and $C_{REF}$ to begin ramping up. Once one of voltages CREF or CEXT reaches a reference voltage $V_{REF}$ (in this case the voltage CREF reaches the threshold voltage $V_{REF}$ first at time $T_3$) the output of comparator 556 generates a low pulse as signal REFB. This causes the CLKOUT and CLK signals to go low and the CLKB signal to go high. When the CLKB signal goes high, transistors 536 and 538 are turned on causing the voltages CREF and CEXT to be discharged. Turning off transistor 532 by CLK going low at $T_3$ causes a voltage CP2 to begin ramping up on capacitor $C_{P2}$. This voltage continues to ramp up until it reaches a reference voltage at time $T_4$ causing the output of comparator 558 P2B to pulse low. This causes clock signal CLK and CLKOUT to go high and clock signal CLKB to go low. This discharges the voltage on capacitor $C_{P2}$ and begins ramping up the voltages on capacitors $C_{EXT}$ and $C_{REF}$.

At time $T_5$, the voltage CEXT on capacitor $C_{EXT}$ reaches the reference voltage prior to the voltage CREF reaching the reference voltage. This causes comparator 554 output to go low generation $d_{out}$. When the voltage CREF reaches the reference voltage at time $T_6$, a low pulse is generated on REFB, and the CLKOUT signal and CLK signal go low while the CLKB signal goes high. This discharges the voltage CREF and CEXT and begins charging of capacitor $C_{P2}$ with voltage CP2. The process repeats as necessary for each of the 16-bits of the SAR algorithm.

With further reference to the timing diagram of FIG. 3 and the diagrams of FIGS. 2a and 2b, the operation will be described in more detail. As noted herein above, the basic clock is provided by CP2 and CREF. CP2 provides one phase of the clock, i.e., that portion when the clock is low and CREF provides the second phase of the clock, i.e., that portion when the clock is high. Therefore, CREF controls the second phase and CEXT does not. With reference to the two ramp voltages for CREF and CEXT, this basically represents a race to the threshold voltage. It is noted that both of the comparators 554 and 556 are fabricated with the same circuitry on the same chip and, therefore, drifts with temperature, delays, etc. will be substantially identical such that any variations thereof will be rejected on a common mode basis. It is only important that $V_{REF}$ for both comparators 554 and 556 be substantially identical and comparator delays be substantially identical. Further, to provide additional immunity from high frequency noise, over and above that associated with the filter 552, these comparators 554 and 556 are designed to be somewhat "sluggish," and such can be accommodated in the SAR algorithm. This provides additional noise immunity. The key to low frequency noise immunity is that the low frequency noise rides on the ramp voltage but the ramp voltage is reset after each bit of the 16-bit SAR cycle is tested such that the low frequency noise is only present over one cycle of the 1 kHz SAR cycle. This means that the low frequency noise is only a factor for a period of one microsecond. This provides low frequency noise rejection.

Figure 4:
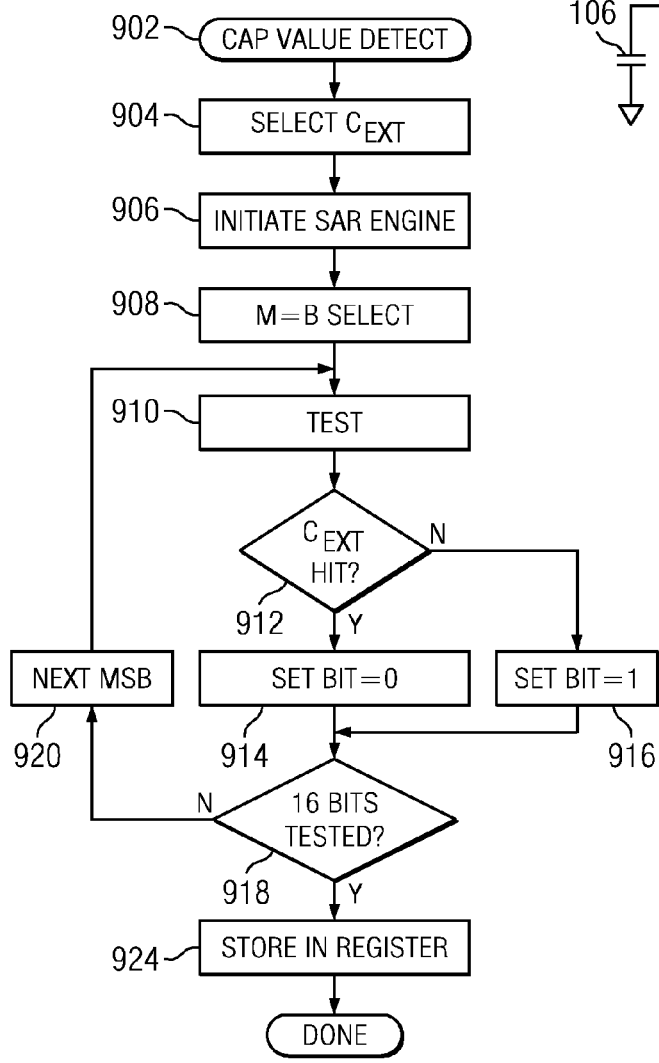
FIG. 4 illustrates a flow chart for the SAR algorithm for detecting the value of a capacitor on an external pin.

Referring now to FIG. 4, there is illustrated a flow chart depicting the operation of the SAR engine 510 which will be described in conjunction with the operation of the timing diagram of FIG. 3. The program is initiated at a block 902 and then proceeds to a function block 904. At function block 904, the multiplexer 544 is operable to select one of the pins. Note that with respect to FIG. 2b, each external capacitance switch is connected to a separate input of the multiplexer 544. It is noted that each external capacitance switch has associated therewith a 16-bit register for storing the value of that external capacitance switch after determination thereof.

Once initiated, the program flows to a block 906 to initiate the SAR engine. The first step is to select the MSB, as indicated by a block 908. This essentially positions the current source 546 at ½ value for the test. With reference to the timing diagram, this occurs on the rising edge of signal EN. At this point, the voltages on the capacitors $C_{EXT}$ and $C_{REF}$ have been discharged to ground and will ramp-up to a voltage depending on the current provided thereto from the respective current sources 546 and 548. As noted herein above, the current source 546 is provided with a current DAC such that the value thereof is a function of the 16-bit value which, for the first cycle is "1000000000000000." The program then flows to a function block 910 which is a test of the particular bit. This test is the ramp-up of the two voltages to determine which arrives at the reference voltage first. In essence, this is a race for both of these voltages to reach the reference voltage.

Basically, for each bit tested, a determination is made as to whether more current should be provided to the capacitor $C_{EXT}$ or less current. When, at the end of CREF, it has been determined that CEXT has crossed the threshold voltage prior to CREF crossing the threshold voltage, this is an indication that too much current has been provided, i.e., the bit being tested needs to be reset to "0." This indicates that the current being provided by current source 546 is charging the capacitor $C_{EXT}$ at too fast a rate. By resetting this bit to "0" and then, on the next bit tested, setting that bit to "1," the current provided to $C_{EXT}$ will be reduced. If, however, it were determined at the end of CREF that CEXT had not crossed the threshold voltage, it is indicated that insufficient current is being provided to the capacitor $C_{EXT}$ and, as such, the bit being tested would remain at "1." It is important to note that each SAR cycle terminates at the end of CREF, at which time CLKB goes high. Therefore, it is not necessary to allow CEXT to ramp all the way up to the threshold voltage. This can be seen specifically with respect to time $T_3$ where the clock signal CLKB goes high at the end of CREF, i.e., there is a reset and transistors 536 and 538 are turned on to discharge $C_{EXT}$ and $C_{REF}$, thus terminating the ramp-up on $C_{EXT}$. Thus, at the end of CREF, a particular SAR bit will be deemed as having been tested. It is at this point in time that a decision is made as to whether to leave the bit set at "1" or reset the bit at "0." This is indicated by there being a "hit" at decision block 912 which is whether CEXT crossed the threshold before the end of CREF, indicating the time at which the voltage across $C_{REF}$ exceeded the threshold. If CEXT exceeded the threshold prior to CREF exceeding the threshold, this would be indicated as a hit and this will indicate that too much current was supplied to $C_{EXT}$, i.e., current source 546 won the race to the threshold voltage. The program will flow along the "Y" path to block 914 to set the SAR bit being tested to "0" indicating that the 16-bit value should be a lower value. However, if the signal CEXT did not exceed the threshold prior to CREF exceeding the threshold, this indicates that there was not a hit, i.e., the current source 546 did not win the race, and the SAR bit being tested will be set to a "1," as indicated by function block 916. After the SAR bit has been tested, the program will flow from either the function block 914 or 916 to decision block 918.

At decision block 918 a determination is made as to if all 16-bits have been tested and, if not, the program flows along a "N" path therefrom to a function block 920 to select the next MSB and then proceeds back to the input of block 910 to again test this bit. This will continue until all 16 bits are tested, at which time the program will flow from the decision block 918 along the "Y" path to a function block 924 to store this value in the associated register. As indicated above, this particular value represents the normalized value of the external capacitance switch. Knowing the absolute value of both currents in current sources 546 and 548 and the absolute value of the capacitor $C_{REF}$, it is possible to actually calculate the absolute value of the external capacitance switch. However, it is not important to calculate this value but, more importantly, to just have a 16-bit value for later determination as to if the value of that external capacitance switch has changed. If the value has changed, a comparison will be made with the pre-stored 16-bit value in the register to determine if the contents need to be updated and such will happen upon such a change.

This change will be noted to a program which will run an algorithm to determine if a "touch" is declared. Any type of algorithm could be utilized for this purpose. The primary purpose of the SAR engine 510 is to determine a 16-bit value for that external capacitance switch for use by the algorithm. This value then can be utilized for comparison with a previously stored value, etc., for determining if the change in capacitance value is of such a nature to declare that a touch has occurred.

It will be appreciated by those skilled in the art and having the benefit of this disclosure that this capacitive sense circuit provides a flexible solution to provide capacitive sensing capabilities for a capacitive sensor array on a single integrated chip to allow for measurement of a capacitor for the purpose of monitoring that value to determine if there has been a change. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A circuit for determining a value of a capacitor, comprising:
    first circuitry for generating a first indication when a variable voltage across the capacitor crosses a threshold voltage;
    second circuitry for generating a second indication when a reference voltage across a reference capacitor crosses the threshold voltage;
    control logic responsive to the first and second indications for generating a control signal indicating whether at least one of the first or second indications occurs before the other of the first or second indications;
    a successive approximation engine for generating an N-bit control value responsive to the control signal;
    a variable current source responsive to the N-bit control value for generating a variable current to the first circuitry;
    a reference current source for generating a reference current to the second circuitry; and
    wherein the value of the capacitor is determined by associated processing circuitry responsive to a value of the reference capacitor, the reference current and the variable current provided by the variable current source when the variable voltage substantially equals the reference voltage.

2. The circuit of claim 1, wherein the first circuitry further comprises a first comparator having a first input connected to monitor the variable voltage across the capacitor and a second input connected to monitor the threshold voltage for generating the first indication.

3. The circuit of claim 2, wherein the second circuitry further comprises a second comparator having a first input connected to monitor the reference voltage across the reference capacitor and a second input connected to monitor the threshold voltage for generating the second indication.

4. The circuit of claim 1 further including a low pass filter for filtering interference from the variable voltage across the capacitor.

5. The circuit of claim 1 further including switching circuitry for discharging the capacitor and for discharging the reference capacitor responsive to the second indication that the reference voltage has exceeded the threshold voltage.

6. The circuit of claim 1 further including:
    third circuitry for generating a third indication when a second reference voltage across a second reference capacitor exceeds the threshold voltage; and
    control logic for generating a clock signal having a first clock edge responsive to the third indication and a second clock edge responsive to the second indication.

7. The circuit of claim 6, wherein the third circuitry further comprises a third comparator having a first input connected to monitor the second reference voltage across the second reference capacitor and a second input connected to monitor the threshold voltage for generating the third indication.

8. The circuit of claim 6 further including switching circuitry for discharging the second reference voltage across the second reference capacitor responsive to the third indication that the second reference voltage has exceeded the threshold voltage.

9. A circuit for determining a value of a capacitor, comprising:
    a first connection to a capacitor switch array;
    a reference capacitor;
    a processing core;
    a first comparator having a first input connected to monitor a charging ramp voltage across a capacitor associated with the capacitor switch array and a second input connected to monitor a threshold voltage for generating a first indication when the charging ramp voltage across the capacitance exceeds the threshold voltage;
    a second comparator having a first input connected to monitor a charging ramp voltage across the reference capacitor and a second input connected to monitor the threshold voltage for generating a second indication when the charging ramp voltage across the reference capacitor crosses the threshold voltage;
    control logic responsive to the first and second indications for generating a control signal indicating when at least one of the first indications or the second indication occurs first;
    a successive approximation engine for generating an N-bit control value responsive to the control signal;
    a variable current source responsive to the N-bit control value for generating a variable current to charge the capacitor to generate the charging ramp voltage across the capacitor;
    a reference current source for generating a reference current to charge the reference capacitor to generate the charging ramp voltage across the reference capacitor; and
    wherein the value of the capacitor may be is determined by the processing core responsive to a value of the reference capacitor, the reference current and the variable current provided by the variable current source when the charging ramp voltage across the capacitor substantially equals the charging ramp voltage across the reference capacitor.

10. The circuit of claim 9 further including a low pass filter for filtering interference from the charging ramp voltage across the capacitor.

11. The circuit of claim 9 further including switching circuitry for discharging the capacitor and for discharging the reference capacitor responsive to the second indication that the charging ramp voltage across the reference capacitor has exceeded the threshold voltage.

12. The circuit of claim 9 further including:
third circuitry for generating a third indication when a charging ramp voltage across a second reference capacitor exceeds the threshold voltage;
wherein the control logic further generates a clock signal having a first clock edge responsive to the third indication and a second clock edge responsive to the second indication.

13. The circuit of claim 9, wherein the third circuitry further comprises a third comparator having a first input connected to monitor the charging ramp voltage across the second reference capacitor and a second input connected to monitor the threshold voltage for generating the third indication.

14. The circuit of claim 9 further including switching circuitry for discharging the second reference capacitor responsive to the third indication that the second reference voltage has exceeded the threshold voltage.

15. A circuit for determining a value of a capacitor, comprising:
a first comparator having a first input connected to monitor a charging ramp voltage across a capacitor and a second input connected to monitor a threshold voltage for generating a first indication when the charging ramp voltage across the capacitor crosses the threshold voltage;
a second comparator having a first input connected to monitor a charging ramp voltage across a reference capacitor and a second input connected to monitor the threshold voltage for generating a second indication when the charging ramp voltage across the reference capacitor crosses the threshold voltage;
a third comparator having a first input connected to monitor a charging ramp voltage across a second reference capacitor and a second input connected to monitor the threshold voltage for generating a third indication when the charging ramp voltage across the second reference capacitor crosses the threshold voltage;
control logic responsive to the first and second indications for generating a control signal indicating when at least one of the first indication or the second indication occurs first, wherein the control logic further generates a clock signal having a first clock edge responsive to the third indication and a second clock edge responsive to the second indication;
a successive approximation engine for generating an N-bit control value responsive to the control signal;
a variable current source responsive to the N-bit control value for generating a variable current to the associated capacitor to generate the charging ramp voltage;
a reference current source for generating a reference current to the reference capacitor to generate the associated charging ramp voltage; and
wherein the value of the capacitor may be is determined by associated processing circuitry responsive to a value of the reference capacitor, the reference current and the variable current provided by the variable current source when the charging ramp voltage across the capacitor substantially equals the charging ramp voltage across the reference capacitor.

16. The circuit of claim 15 further including a low pass filter for filtering interference from the charging voltage across the capacitor.

17. The circuit of claim 15 further including switching circuitry for discharging capacitor and for discharging the reference capacitor responsive to the second indication that the charging ramp voltage across the reference capacitor has crossed the threshold voltage.

18. The circuit of claim 17 further including second switching circuitry for discharging the second reference capacitor responsive to the third indication that the associated charging ramp voltage has crossed the threshold voltage.

\* \* \* \* \*